(12) United States Patent
von Staudt

(10) Patent No.: US 8,421,659 B2
(45) Date of Patent: Apr. 16, 2013

(54) MINIMUM DIFFERENTIAL NON-LINEARITY TRIM DAC

(75) Inventor: Hans Martin von Staudt, Kingston Bagpuize (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 117 days.

(21) Appl. No.: 12/932,376

(22) Filed: Feb. 24, 2011

(65) Prior Publication Data
US 2012/0206283 A1    Aug. 16, 2012

(30) Foreign Application Priority Data
Feb. 11, 2011    (EP) .................................. 11392001

(51) Int. Cl.
*H03M 1/10*    (2006.01)
(52) U.S. Cl.
USPC ......................................... 341/121; 341/144
(58) Field of Classification Search .................. 341/120, 341/121, 144
See application file for complete search history.

(56) References Cited

U.S. PATENT DOCUMENTS

| | | | |
|---|---|---|---|
| 4,272,760 A * | 6/1981 | Prazak et al. ................. | 341/120 |
| 5,352,973 A | 10/1994 | Audy | |
| 5,666,118 A | 9/1997 | Gersbach | |
| 6,157,245 A | 12/2000 | Rincon-Mora | |
| 6,329,804 B1 | 12/2001 | Mercer | |
| 6,417,794 B1 | 7/2002 | Munoz et al. | |
| 6,504,394 B2 | 1/2003 | Ohlhoff | |
| 6,556,161 B2 | 4/2003 | Nuijten | |
| 6,664,909 B1 * | 12/2003 | Hyde et al. .................... | 341/144 |
| 6,671,221 B2 | 12/2003 | Beer et al. | |
| 6,703,955 B2 | 3/2004 | Otani et al. | |
| 6,897,794 B2 | 5/2005 | Kuyel et al. | |
| 6,906,581 B2 | 6/2005 | Kang et al. | |
| 6,909,642 B2 | 6/2005 | Lehmann et al. | |
| 7,002,496 B2 | 2/2006 | Kuyel | |
| 7,019,585 B1 | 3/2006 | Wilson et al. | |
| 7,049,985 B2 * | 5/2006 | Karasawa et al. ............. | 341/121 |
| 7,193,548 B2 | 3/2007 | Kaplan | |

(Continued)

FOREIGN PATENT DOCUMENTS

EP    2 253 966    11/2010
WO    WO 2006/031292    3/2006

OTHER PUBLICATIONS

Co-pending US Patent DS08-005, U.S. Appl. No. 12/455,530, filed Jun. 3, 2009, "Self-Trim and Self-Test of On-Chip Values," assigned to the same assignee as the present invention, 25 pgs.
Co-pending US Patent DS09-004, U.S. Appl. No. 12/800,491, filed May 17, 2010, "Driver Chip Based OLED Module Connectivity Test," assigned to the same asignee as the present invention, 24 pgs.

(Continued)

*Primary Examiner* — Brian Young
(74) *Attorney, Agent, or Firm* — Saile Ackerman LLC; Stephen B. Ackerman

(57) ABSTRACT

A trim DAC wherein the digital input bits to the trim DAC are controlled by a state machine to produce an analog output that is within a least significant bit of the digital input bits. An undersize factor between digital input bits is used to assist in finding a trim solution for major transitions of the digital input bits. Trim solutions are stored in a nonvolatile memory associated with the state machine to be used in creating an accurate analog output.

13 Claims, 3 Drawing Sheets

U.S. PATENT DOCUMENTS

| | | | |
|---|---|---|---|
| 7,277,350 B2 | 10/2007 | Huckaby et al. | |
| 7,362,247 B2 | 4/2008 | Arias et al. | |
| 7,411,380 B2 | 8/2008 | Chang et al. | |
| 7,433,790 B2 | 10/2008 | Anderson et al. | |
| 7,468,686 B2 * | 12/2008 | Brubaker | 341/121 |
| 7,642,852 B2 | 1/2010 | Chandra et al. | |
| 7,675,792 B2 | 3/2010 | Bedeschi et al. | |

OTHER PUBLICATIONS

"Sellf-Calibration of Input-Match in RF Front-end Circuitry," by Tejasvi Das et al., IEEE Transactions on Circuits and Systems-II: Express Briefs, vol. 52, No. 12, Dec. 2005, pp. 821-825.

European Search Report—App.No. 11392001.1-1233, mail date—Sep. 1, 2011, Dialog Semiconductor GmbH.

* cited by examiner

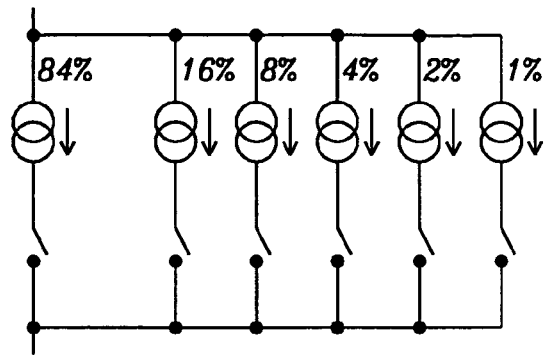
FIG. 1A – Prior Art
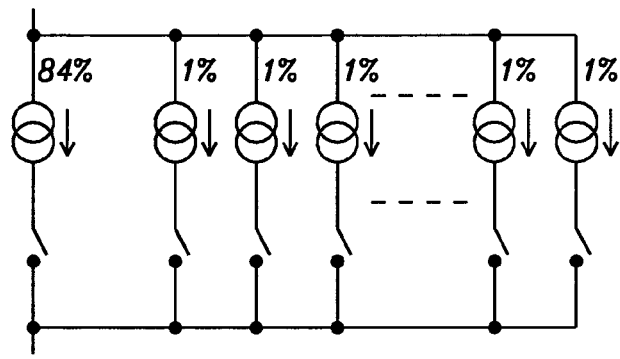
FIG. 1B – Prior Art
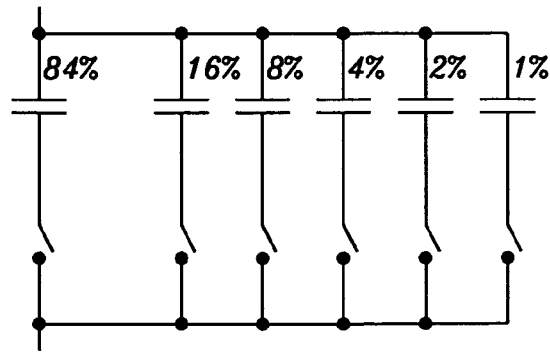
FIG. 1C – Prior Art

MINIMUM DIFFERENTIAL NON-LINEARITY TRIM DAC

This application is related to U.S. patent application Ser. No. 12/455,530, filed on Jun. 3, 2009, and assigned to the same assignee as the present invention, and which is herein incorporated by reference in its entirety.

BACKGROUND OF THE INVENTION

1. Field of Invention

The present invention is related mixed-signal integrated circuits and in particular the trimming digital to analog converters comprising voltage, current, time and frequency.

2. Description of Related Art

The trend in microelectronics is the continued creation of smaller and smaller devices, wherein as the devices become smaller, variations in the fringe of each shape of a device become a larger portion of the of the performance characteristics of the device and cause variations in the performance of a circuit dependent on the device. This is particularly important in circuits that convert from one signal domain to another where precision in the conversion is required such as digital to analog converters. The variation in the output signal compared to an ideal response is known as a differential non-linearity (DNL) of the converted output signal.

There are several approaches to correcting for manufacturing process variations in the production of semiconductor circuits, which attempt to correct for variations producing analog values. In FIG. 1A is shown a binary weighted trim DAC of prior art in which an analog signal (current) is created that starts with a current generator producing 84% of the required analog signal and selectable additional current to attain 100% of the value of the analog signal that is required. Selection is by digitally controlling switches, which allow the current from the additional circuits to be added to the current of the current generator producing 84% of the required current. FIG. 1B is an approach of the prior art that is similar to that of FIG. 1A with the exception that each element of the selectable additional current has N elements of the minimum selectable current of the circuit of FIG. 1A. FIG. 1C of prior art is similar to FIG. 1A, but uses capacitance as the parameter that is being totalized to 100%. Another example of prior art is shown in FIG. 1D, where selectable elements of a voltage divider are used to create a voltage that is commensurate with the digital input. It should be noted that the values of the switchable elements are double the previous element, e.g. 1, 2, 4, 8, etc. In FIG. 1E is a resistor voltage divider stack where each resistor is of the same value and a series of switches between each resistor is used to select the desired voltage. In the general, the circuits of FIG. 1A through 1E form a DAC as a digital control in generating an analog value. These methods can provide useful results with the potential drag on conversion time needed to determine values created at the time of calibration.

U.S. Pat. No. 7,277,350 (Huckaby et al.) is directed to a method and apparatus for adjusting trim settings for internally generated voltages comparing a target digital value to a present digital value to introduce a trim value. U.S. Pat. No. 6,703,955 (Otani et al.) is directed to a code in which resistor selection produces an output voltage that represents an input voltage. In U.S. Pat. No. 6,504,394 (Ohlhoff), a circuit is directed to trimming reference voltages where the reference voltages are compared to an external comparison voltage. U.S. Pat. No. 7,193,548 B2 (Kaplan) is directed to a digital-to-analog converter mismatch shaper using a delta sigma modulator that has analog signal processing components. In U.S. Pat. No. 7,675,792 B2 (Bedeschi et al.), a voltage and a current reference generator are directed to a control stage couple to the reference generator stage to adjust trimmable parameters. U.S. Pat. No. 7,642,852 B2 (Chandra et al.), is directed to a method and apparatus for trimming values of load resistors to reduce variation in a common mode feedback loop of an operational amplifier. U.S. Pat. No. 7,433,790 (Anderson et al.) is directed to trimming of a reference controlled by an algorithm executed by logic circuitry.

U.S. Pat. No. 7,411,380 B2 (Chang et al.) is directed to a non-linear compensation circuit for compensating non-linear effects of a voltage reference. U.S. Pat. No. 7,362,247 B2 (Arias et al.) is directed to digital correction of a multi-bit ADAC non-linearities for error feedback. U.S. Pat. No. 7,019,585 B1 (Wilson et al.) is directed to a voltage trim circuit using an operational amplifier, a transistor, a voltage divider and a bias current circuit. In U.S. Pat. No. 7,002,496 B2 (Kuyel) a system and method is directed to calibrating a digital-to-analog converter comprising a memory and logic circuitry for performing arithmetic operations. U.S. Pat. No. 6,909,642 B2 (Lehmann et al.) is directed to integrated circuit chips capable and the method thereof for self-adjusting the internal voltage the integrated circuit chip. U.S. Pat. No. 6,906,581 B2 (Kang et al.) is directed to a fast start low-voltage bandgap voltage reference circuit using a first current generator with a positive temperature coefficient and second current generator with a negative temperature coefficient. IN U.S. Pat. No. 6,897,794 B2 (Kuyel et al.) a system and method is directed to calibrating a digital-to analog converter that makes use of a resistor string. In U.S. Pat. No. 6,671,221 B2 (Beer et al.) a circuit is directed to trimming the frequency of an oscillator.

U.S. Pat. No. 6,556,161 B2 (Nuijten) is directed to a multi-bit digital-to-analog converter comprising a plurality of conversion elements that are selected by dynamic element matching. In U.S. Pat. No. 6,329,804 B1 (Mercer) a method and apparatus is directed to trimming the level and slope in a voltage reference using a current switching DAC. U.S. Pat. No. 6,157,245 (Rincon-Mora) is directed to a curvature corrected bandgap reference voltage circuit independent of temperature operation of the circuit. U.S. Pat. No. 5,666,118 (Gersbach) is directed to a method of self-calibration for a segmented digital-to-analog converter comprising an output consisting of a voltage step and a trim value. U.S. Pat. No. 5,352,973 (Audy) is directed to an output curvature correction for a bandgap reference circuit that exhibits a temperature dependent output. In Das, T. et al.; inventor identified, "Self-calibration of input-match in RF front-end circuitry" IEEE Transactions, vol 52, no. 12, pp. 821-825, December 2005 is directed to a technique to ascertain an input match frequency of a circuit by using a built-in-self-test structure, determines the frequency interval that needs to be shifted and feeds back a digital word to correct the input mismatch.

SUMMARY OF THE INVENTION

It is an objective of the present invention to trim the output of a DAC to within one LSB, wherein a trimmed value is a product of the digital input bits times a factor two between bits minus an undersize fraction where the undersize fraction is between, but not including, zero and one.

It is also an objective of the present invention wherein the conversions of all bits are undersized excluding the least significant bit.

It is still an objective of the present invention wherein the conversions of the more significant bits are undersized.

It is still further an objective of the present invention wherein the conversions of the least significant bits are oversized by a fraction between, but not including, zero and one.

It is yet another objective of the present invention to detect outlier values and form a rectangular distribution between plus and minus one half of an LSB.

In the present invention a DAC is trimmed to eliminate an error caused in the analog output by variations in the semiconductor process or minor defects that do not prevent the circuitry from working accurately. A trim circuit controlled by a state machine and comprising a T-DAC (trim DAC) is connected to the analog output of the DAC to measure the value of the analog output of the DAC with respect to a reference signal in order to control the T-DAC to adjust the value of the conversion of the digital signal to an analog value the output of the DAC to within plus or minus one half LSB of the digital input to the DAC. Contained within the state machine is a nonvolatile memory to store T-DAC settings for all combinations of the digital input to the DAC.

The operation of the T-DAC essentially forms a rectangular distribution of the analog output of the circuit that is one LSB wide at the analog target value required by the digital input to the DAC, wherein an undersized trim bit is used to help form a one bit wide distribution. The undersize value of a trim bit can be different for each trim bit; therefore, creating a collection of undersize values. The mathematical description of the operation of N-bit T-DAC is as follows.

$$\text{trim}[0] = 1 \text{LSB}$$

$$\text{trim}[n] = (2 - a_n) \times \text{trim}[n-1] \text{ for } n \in [0, N-1]$$

with at least one $a_n$ complying with $1 > a_n > 0$
where typical values of $a_n$ are 0.1 to 0.5

Shown in TABLE 1 is an example of reducing the factor (undersize fraction) by a small amount between the next more significant bit and the previous bit of the trim DAC. In the case of TABLE 1 with all $a_n = 0.1$ or a 5% reduction. This forms a trim DAC with a strong negative DNL (differential non-linearity), which greatly reduces the probability that any major transition is greater than one LSB; and therefore, allowing the algorithm of the trim DAC to converge on a target distribution of one LSB. The major disadvantage of the approach shown in TABLE 1 is that there is a reduction in the trim range.

TABLE 1

|         | MSB   |       |      |      |     | LSB |
|---------|-------|-------|------|------|-----|-----|
| Nominal | 32    | 16    | 8    | 4    | 2   | 1   |
| Real    | 26.13 | 13.75 | 7.24 | 3.81 | 1.9 | 1.0 |

In TABLE 2 is shown an alternative to the undersizing in TABLE 1 where only the two most significant bits (most significant trim elements) are undersized by an undersize fraction, which addresses the DNL of the upper two major transitions (011111 to 100000 and x01111 To x10000).

TABLE 2

|         | MSB   |      |     |     |     | LSB |
|---------|-------|------|-----|-----|-----|-----|
| Nominal | 32    | 16   | 8   | 4   | 2   | 1   |
| Real    | 28.88 | 15.2 | 8.0 | 4.0 | 2.0 | 1.0 |

In practice a trim DAC, as it is with other design elements, which require good matching, are designed in unit elements. Thus fractional ratios are generally not used. TABLE 3 demonstrates the use of unit ratios between the most significant bits. This is accomplished by reducing the unit ratio by one for the doubled value for each more significant bit. In TABLE 3 this reduction is shown for the three most significant bits of a six bit trim DAC.

TABLE 3

|         | MSB  |      |     |     |     | LSB |
|---------|------|------|-----|-----|-----|-----|
| Nominal | 32   | 16   | 8   | 4   | 2   | 1   |
| Real    | 27.0 | 15.0 | 7.0 | 4.0 | 2.0 | 1.0 |

In the situation where the reduction in the trim range is not acceptable, an oversizing of the least significant bits would provide similar trim results, as shown in TABLE 4. This approach would result in the widening of the trim distribution, which could be as wide as the LSB.

TABLE 4

|         | MSB  |      |     |     |     | LSB |
|---------|------|------|-----|-----|-----|-----|
| Nominal | 32   | 16   | 8   | 4   | 2   | 1   |
| Real    | 32.0 | 16.0 | 8.0 | 4.0 | 2.2 | 1.2 |

The approach demonstrated in the present invention is applicable to any DAC application and is particularly applicable and useful in comparator based self-trim schemes. There are no restrictions on the trim algorithm, whether the search is linear, binary or left sided versus right sided. Further the approach demonstrated herein is applicable to a voltage DAC, a current DAC a frequency DAC or any other DAC that converts a set of digital signals into an analog output to control, condition or change an analog value or parameter.

BRIEF DESCRIPTION OF THE DRAWINGS

This invention will be described with reference to the accompanying drawings, wherein:

FIG. 1A to 1E are trim approaches of prior art;

DETAILED DESCRIPTION OF THE PREFERRED EMBODIMENT

Figure 1D:
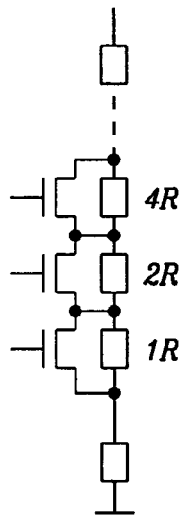
Figure 1E:
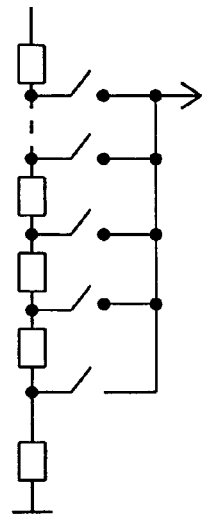
Figure 2A:
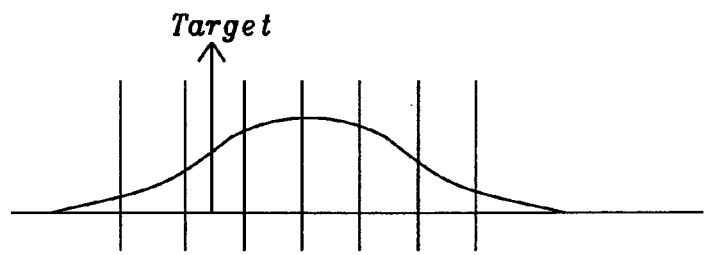
FIG. 2A is a distribution of an untrimmed analog output value, as manufactured and separated into 1LSB units.
Figure 2B:
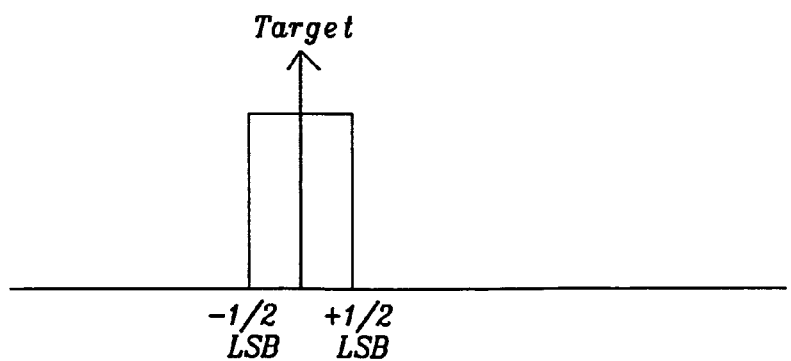
FIG. 2B is a rectangular distribution of a trimmed output of a DAC of the present invention.

In FIG. 2A of the present invention is shown a natural distribution of the analog output of a DAC, which includes variations from device to device on a chip, chip to chip, wafer to wafer and batch to batch of the semiconductor product containing a DAC. The distribution is divided into one LSB sections with a target value demonstrating an example where the proper analog value could exist with respect to the distribution. FIG. 2B demonstrates the result of the present invention where the procedures of the present invention produced a rectangular distribution one LSB wide. The rectangular distribution of FIG. 2B represents the results of the trim DAC (T-DAC) to modify the natural distribution of FIG. 2A to form a T-DAC output that is plus or minus one half of a LSB around the target value.

Figure 3:
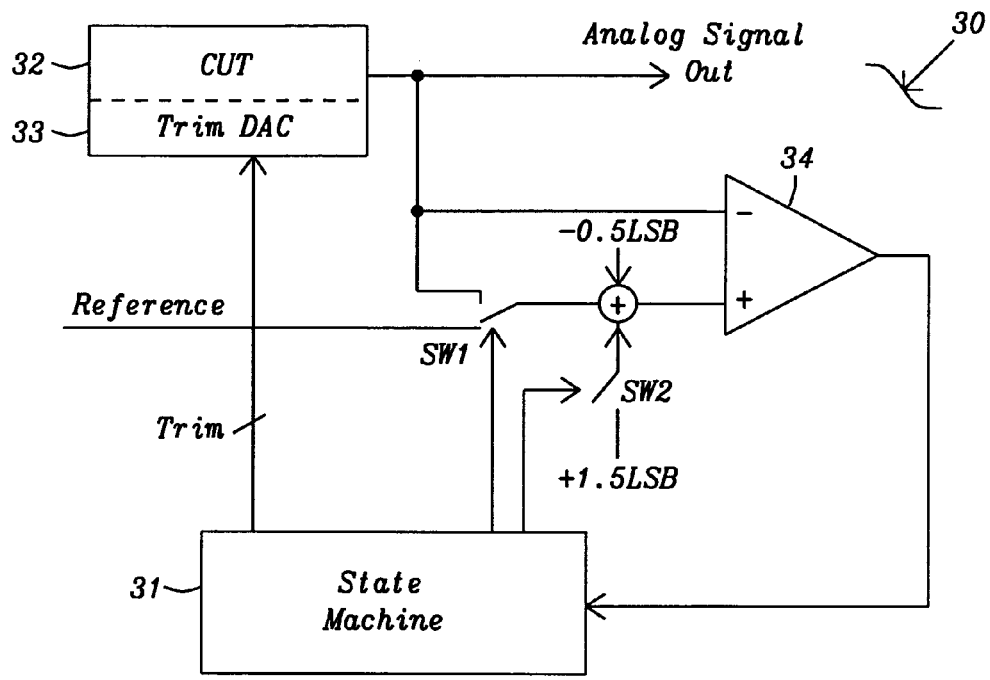
FIG. 3 is a block diagram of the trim circuit of the present invention.

In FIG. 3 is shown a block diagram of the test circuit 30 of the present invention in which a state machine 31 controls a CUT (Circuit Under Trim) 32 comprising a T-DAC (trim DAC) 33. The CUT can be a DAC having the capability to be digitally trimmed under the control of the state machine 31. The analog output of the CUT is connected to a comparator 34, which is compared to a reference provided by an automatic tester (ATE). The output of the comparator 34 is used to provide a digital signal to the T-DAC to correct the analog output signal to provide a value that is accurate within plus or minus one half of a LSB of a digital input value The trim algorithm within the state machine 31 controls the T-DAC 33 to produce an analog output signal that is equivalent to the digital trim data including any undersize fraction. The digital trim data required to produce an analog output for a digital input is stored in a nonvolatile memory associated with the state machine 31, which is used to lookup the appropriate combination of bits and the T-DAC settings to be used to correct for manufacturing variations in order to produce an accurate analog output for each combination of digital input bits to the CUT 32. The undersize fraction, as aforementioned, enhances the probability of finding an equivalent output for major digital transitions, for example 011111 to 100000, x01111 to x10000 and xx0111 to xx1000.

The state machine 31 controls the T-DAC 33 with trim data in an attempt to form a rectangular distribution of the analog output that is one LSB wide. The state machine performs a search of the input bits of the T-DAC that finds a combination that produces the desired rectangular distribution. Depending upon the direction of the search the rectangular distribution will be on one side of the reference or the other.

A reference signal is supplied by the ATE through a switch SW1 is initially combined with a voltage representing a negative one half LSB at the summing junction of the positive input to the comparator 34. This determines whether the T-DAC has produced a result that is beyond the left portion (less positive portion) of the rectangular distribution. Then switch SW2 is activated to add a voltage that represents a plus one and a half LSB to the summing junction. The one and one half LSB addition to the summing junction cancels out the negative one half LSB and sets the positive input to the comparator to a voltage equivalent of a plus one LSB and tests for the trimmed DAC results to be less than one LSB wide.

Figure 4:
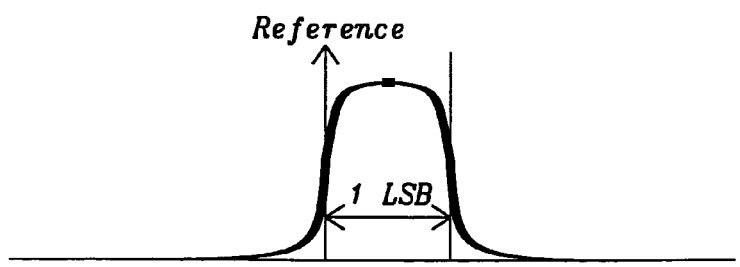
FIG. 4 is a rectangular trim distribution of the present invention that is modified by the DNL of the trim DAC.

In FIG. 4 is shown a distribution of the analog signal output (see FIG. 3) of the trim DAC circuit 30 of the present invention. The distribution has a width of one LSB starting at the value of the tester reference. On both sides of the main part of the distribution, which is one LSB wide, are tails of the distribution where the trim algorithm will shape the distribution and where the comparator based trim eliminates the left tail before the reference. The right tail of the distribution represents failed product where the trim algorithm is unable to bring that portion of the product within the 1 LSB portion of the distribution to the right of the reference.

Whereas the example discussed herein is a circuit under test is a DAC with a voltage output, it should be noted that the analog output signal can be current or any other measurable analog signal. Further the approach demonstrated herein can be used in the conversion of analog signals to digital signals.

While the invention has been particularly shown and described with reference to preferred embodiments thereof, it will be understood by those skilled in the art that various changes in form and details may be made without departing from the spirit and scope of the invention.

What is claimed is:

1. A method of trimming an analog value using a trim DAC, comprising:
   a) measuring an analog output of a trim DAC;
   b) forming an nth bit, wherein an undersize factor of an analog equivalence between the nth bit and an n−1 bit of the trim DAC narrows a distribution of a value of said analog output;
   c) forming a difference factor between logically adjacent binary bits that is an undersized fraction of a normal difference; and
   d) reducing a probability of a major transition between digital bits greater than a least significant bit.

2. A method of trimming an analog value using a trim DAC, comprising:
   a) measuring an analog output of a trim DAC; and
   b) forming an nth bit, wherein an undersize factor of an analog equivalence between the nth bit and an n−1 bit of the trim DAC narrows a distribution of a value of said analog output and wherein said undersize factor is less than one and greater than zero.

3. A method of trimming an analog value using a trim DAC, comprising:
   a) measuring an analog output of a trim DAC; and
   b) forming an nth bit, wherein an undersize factor of an analog equivalence between the nth bit and an n−1 bit of the trim DAC narrows a distribution of a value of said analog output and wherein said undersize factor between bits is applied to bits between a most significant bit and a second least significant bit of the digital input of said trim DAC.

4. A method of trimming an analog value using a trim DAC, comprising:
   a) measuring an analog output of a trim DAC; and
   b) forming an nth bit, wherein an undersize factor of an analog equivalence between the nth bit and an n−1 bit of the trim DAC narrows a distribution of a value of said analog output and wherein said undersize factor between bits is applied to a first M most significant bits.

5. A method of trimming an analog value using a trim DAC, comprising:
   a) measuring an analog output of a trim DAC; and
   b) forming an nth bit, wherein an undersize factor of an analog equivalence between the nth bit and an n−1 bit of the trim DAC narrows a distribution of a value of said analog output and wherein said undersize factor between bits is replaced with an oversize of a last L least significant bits.

6. A trim DAC, comprising:
   a) a first binary trim bit;
   b) a second binary trim bit, wherein said second binary trim bit forms a next more significant binary trim bit to said first binary trim bit;
   c) said next more significant binary trim bit an undersized fraction of a normal difference factor between logically adjacent binary bits; and
   d) said undersize fraction reduces the probability of a major transition greater than a least significant bit.

7. The trim DAC of claim 6, wherein said undersize fraction is a fraction (less than one and greater than zero) of the normal difference factor between logically adjacent binary bits.

8. The trim DAC of claim 6, wherein said undersize fraction is applied to all binary trim bits except a least significant binary trim bit.

9. The trim DAC of claim 6, wherein said undersize fraction is applied to most significant trim bits.

10. The trim DAC of claim 9, wherein the most significant trim bits are a most significant trim bit and a next most significant trim bit.

11. The trim DAC of claim 6, wherein said undersize fraction is applied in a unit value of the least significant bit and applied to more significant trim bits higher in significance than a second least significant trim bit.

12. The trim DAC of claim 6, wherein said first binary trim bit is a least significant bit and said second binary trim bit is a next least significant bit, wherein an oversize factor is applied to the first and second binary trim bits.

13. The trim DAC of claim 12, wherein the oversize factor maintains a range of the trim DAC at an expense of a wider trim distribution.

* * * * *